(12) United States Patent
Nagaishi

(10) Patent No.: US 10,537,049 B2
(45) Date of Patent: Jan. 14, 2020

(54) COMPONENT ATTACHMENT APPARATUS AND COMPONENT ATTACHMENT METHOD

(71) Applicant: FUJI CORPORATION, Chiryu-shi (JP)

(72) Inventor: Takuya Nagaishi, Okazaki (JP)

(73) Assignee: FUJI CORPORATION, Chiryu-shi (JP)

( * ) Notice: Subject to any disclaimer, the term of this patent is extended or adjusted under 35 U.S.C. 154(b) by 245 days.

(21) Appl. No.: 15/573,008

(22) PCT Filed: May 29, 2015

(86) PCT No.: PCT/JP2015/065525
§ 371 (c)(1),
(2) Date: Nov. 9, 2017

(87) PCT Pub. No.: WO2016/194035
PCT Pub. Date: Dec. 8, 2016

(65) Prior Publication Data
US 2018/0124961 A1    May 3, 2018

(51) Int. Cl.
*H05K 13/04* (2006.01)
*H05K 13/00* (2006.01)
*H05K 13/08* (2006.01)

(52) U.S. Cl.
CPC ......... *H05K 13/04* (2013.01); *H05K 13/0408* (2013.01); *H05K 13/0409* (2018.08);
(Continued)

(58) Field of Classification Search
CPC .. H05K 13/022; H05K 13/04; H05K 13/0404; H05K 13/0408; H05K 13/0409;
(Continued)

(56) References Cited

U.S. PATENT DOCUMENTS

| 5,068,588 A | 11/1991 | Kubota et al. |
| 6,429,387 B1 | 8/2002 | Kuribayashi et al. |
| 2001/0027877 A1 | 10/2001 | Kuribayashi et al. |

FOREIGN PATENT DOCUMENTS

| EP | 0 374 848 A2 | 6/1990 |
| EP | 0 948 250 A1 | 10/1999 |

(Continued)

OTHER PUBLICATIONS

Extended European Search Report dated Dec. 14, 2018 in Patent Application No. 15894070.0.
(Continued)

*Primary Examiner* — Peter Dungba Vo
*Assistant Examiner* — Joshua D Anderson
(74) *Attorney, Agent, or Firm* — Oblon, McClelland, Maier & Neustadt, L.L.P.

(57) ABSTRACT

A component attachment apparatus picks up a first component supplied to supply position of a first stick feeder with a head, assembles the first component and a second component by inserting a lead of the first component held by the head into an insertion hole of the second component supplied to supply position of a second stick feeder, and then attaches the assembly to a board. Therefore, in comparison with a case where the first component attached to the second component after the second component is attached to the board, it is possible to stably attach the components to the board with low influence of warping of the board.

6 Claims, 9 Drawing Sheets

(52) U.S. Cl.
CPC ..... *H05K 13/0413* (2013.01); *H05K 13/0812* (2018.08); *H05K 13/0813* (2018.08); *Y10T 29/49133* (2015.01); *Y10T 29/53174* (2015.01)

(58) Field of Classification Search
CPC ........... H05K 13/0413; H05K 13/0439; H05K 13/08; H05K 13/081; H05K 13/0812; H05K 13/0813; H05K 13/0815; Y10T 29/49124; Y10T 29/49128; Y10T 29/4913; Y10T 29/49131; Y10T 29/49133; Y10T 29/49139; Y10T 29/49147; Y10T 29/53174; Y10T 29/53178; Y10T 29/53183; Y10T 29/53191
See application file for complete search history.

(56) References Cited

FOREIGN PATENT DOCUMENTS

| | | |
|---|---|---|
| JP | 6-127698 A | 5/1994 |
| JP | 7-116984 A | 5/1995 |
| JP | 2001-53499 A | 2/2001 |
| JP | 2002-237696 A | 8/2002 |
| JP | 2008-198926 A | 8/2008 |
| JP | 2008-198927 A | 8/2008 |

OTHER PUBLICATIONS

International Search Report dated Aug. 25, 2015 in PCT/JP2015/065525 filed May 29, 2015.

(a)

(b)

COMPONENT ATTACHMENT APPARATUS AND COMPONENT ATTACHMENT METHOD

TECHNICAL FIELD

The present application relates to a component attachment apparatus and a component attachment method.

BACKGROUND ART

In the related art, as a component attachment apparatus for attaching a component to a board, there is known a component attachment apparatus in which a lead is inserted into an insertion hole formed in a board so that a component is attached. For example, in an apparatus disclosed in PTL 1, a component can be stably attached to a board since an insertion guide that pinches a lead and guides the lead to an insertion hole of the board and a pressing rod that holds and presses a head portion of the component are used.

CITATION LIST

Patent Literature

PTL 1: JP-A-2001-53499

SUMMARY

Technical Problem

Meanwhile, there are cases where another component is attached to a component attached to a board, such as a case where a lead of another component is inserted into an insertion hole of a component, in which an insertion hole is formed, that has already been attached to the board. If the board has a warped portion or the like in such a case, the component that is attached later is attached in a state where the component that is attached to the board first is inclined. Therefore, the component may not be able to be stably attached even if the insertion guide or the like is used.

A main object of the present disclosure is to stably attach a component to a board without a decrease in component attachment efficiency.

Solution to Problem

The present disclosure has adopted the following means in order to achieve the above-described main object.

A component attachment apparatus according to the disclosure is a component attachment apparatus which holds a component with a head and attaches the component to a board, the apparatus including a first component supply section configured to supply a first component; a second component supply section configured to supply a second component that can be connected to the first component; a holding control section configured to perform a holding control process of controlling the head such that the head holds the first component supplied to a supply position of the first component supply section, then connects the first component held by the head to the second component supplied to a supply position of the second component supply section such that the head holds an assembly that is obtained by assembling the first component and the second component; and an attachment control section configured to perform an attachment control process of controlling the head such that the assembly held by the head is attached to the board.

The component attachment apparatus assembles the first component and the second component by connecting the first component held by the head to the second component supplied to the supply position and then attaches the assembly to the board. Therefore, in comparison with a case where the first component is attached to the second component after the second component is attached to the board, it is possible to stably attach the component with low influence of warping of the board. In addition, since the first component and the second component are assembled at the supply position to which the second component is supplied, it is possible to suppress movement loss of the component at the time of assembly and to prevent a decrease in component attachment efficiency. Therefore, it is possible to stably attach the component to the board without a decrease in component attachment efficiency.

In the component attachment apparatus according to the disclosure, a lower portion of the first component may be provided with a connecting portion, an upper portion of the second component may be provided with a connecting target portion that is connected to the connecting portion, the component attachment apparatus may further include a lower imaging device configured to image the component held by the head from below, an upper imaging device configured to image the component supplied to the supply position from above, and an imaging control section that configured to control the lower imaging device such that the lower imaging device images the connecting portion of the first component held by the head from below and controls the upper imaging device such that the upper imaging device images the connecting target portion of the second component supplied to the supply position of the second component supply section from above, and the holding control section may control the head such that the first component held by the head is connected to the second component at a position that is set with respect to the supply position of the second component based on images captured by the lower imaging device and the upper imaging device such that the connecting portion and the connecting target portion can be connected to each other. In this case, since it is possible to more accurately connect the first component held by the head to the second component supplied to the supply position, it is possible to prevent assembly failure or the like.

In the component attachment apparatus according to the disclosure, the head may be configured to be capable of switching a direction in which the head holds the component between a first direction that is a vertical direction and a second direction that is orthogonal to the first direction, the holding control section may perform the holding control process in a state where a direction in which the head faces is switched to the first direction, and the attachment control section may perform the attachment control process in a state where a direction in which the head faces is switched to the second direction. In this case, it is possible to appropriately cope with even a case where a direction in which the component supplied to the supply position is held and a direction in which the component (the assembly) is attached to the board are different from each other and to stably attach the component to the board.

In the component attachment apparatus according to the disclosure, the first component and the second component may be connected to each other such that the first component becomes detachable with respect to the second component after the first component and the second component are attached to the board as the assembly. It can be said that such components are suitable for being attached to the board after being connected and assembled, therefore, application of the present disclosure to these components is highly meaningful. In addition, examples of a component that is detachable as described above and can be easily replaced include a fuse and a DIP IC.

In the component attachment apparatus according to the disclosure, one of the first component and the second component maybe provided with a lead that protrudes outwards, the other of the first component and the second component maybe provided with an insertion hole, and the first component and the second component may be connected to each other when the lead is inserted into the insertion hole. Such an insertion hole of the component is provided with only a slight gap with respect to the lead and in a case where the second component is attached to the board first, if the second component is inclined being influenced by warping of the board, it is difficult to insert the lead into the insertion hole, therefore, application of the present disclosure is highly meaningful in this case.

A component attachment method according to the disclosure is a component attachment method in which component is held with a head and attached the component to a board, the method including: (a) using the head to hold a first component supplied to a first supply position, (b) using the head to hold an assembly that is obtained by assembling the first component and a second component by connecting the first component held by the head to the second component supplied to a second supply position, and (c) attaching the assembly held by the head to the board.

In the component attachment method according to the disclosure, the assembly is attached to the board after the assembly that is obtained by assembling the first component and the second component by connecting the first component held by the head to the second component supplied to the second supply position is held by the head. Therefore, it is possible to stably attach the component to the board without a decrease in component attachment efficiency. Note that, in the component attachment method, various aspects of the above-described component attachment apparatus may be adopted and steps for realizing each function of the above-described component attachment apparatus may be added.

DESCRIPTION OF EMBODIMENTS

Figure 1:
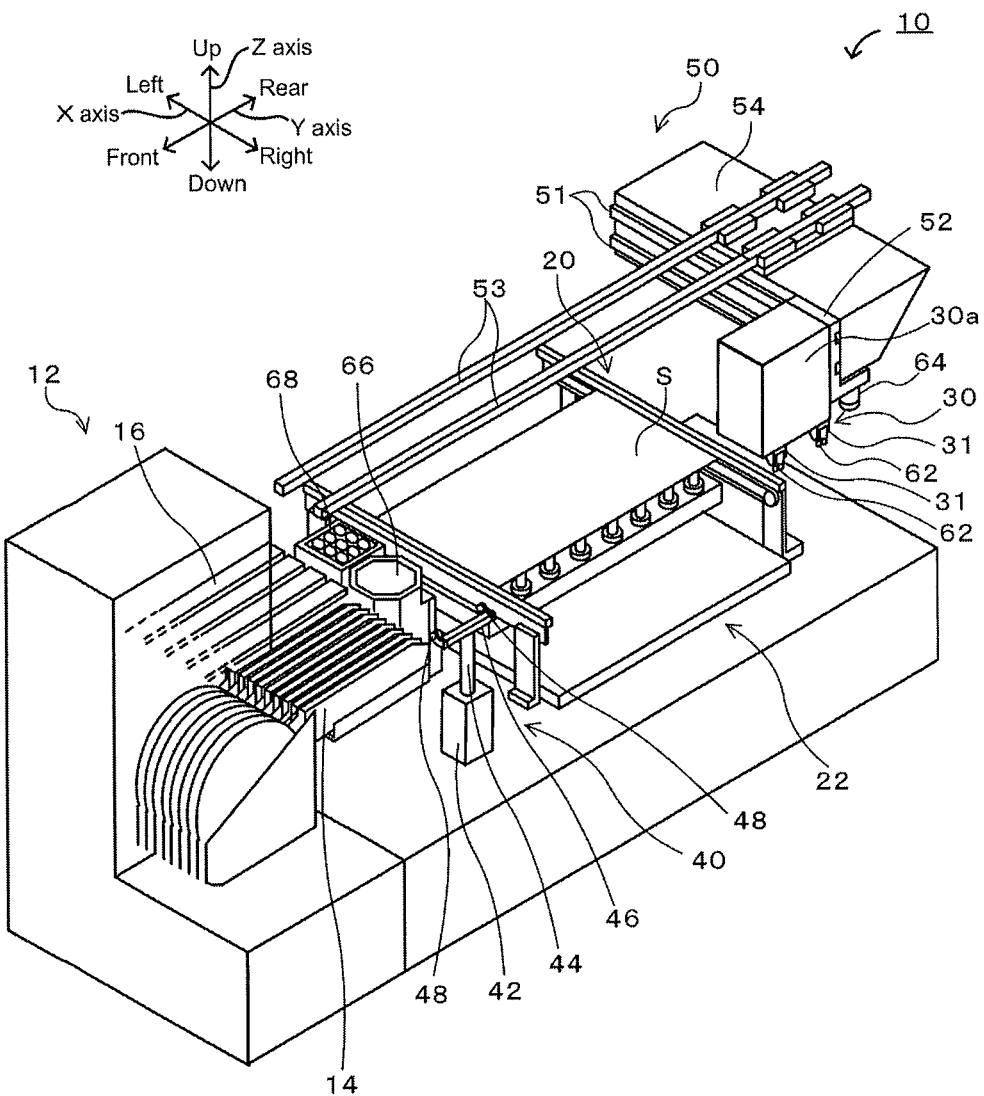
FIG. 1 is a configuration view schematically illustrating a configuration of component attachment apparatus 10.
Figure 2:
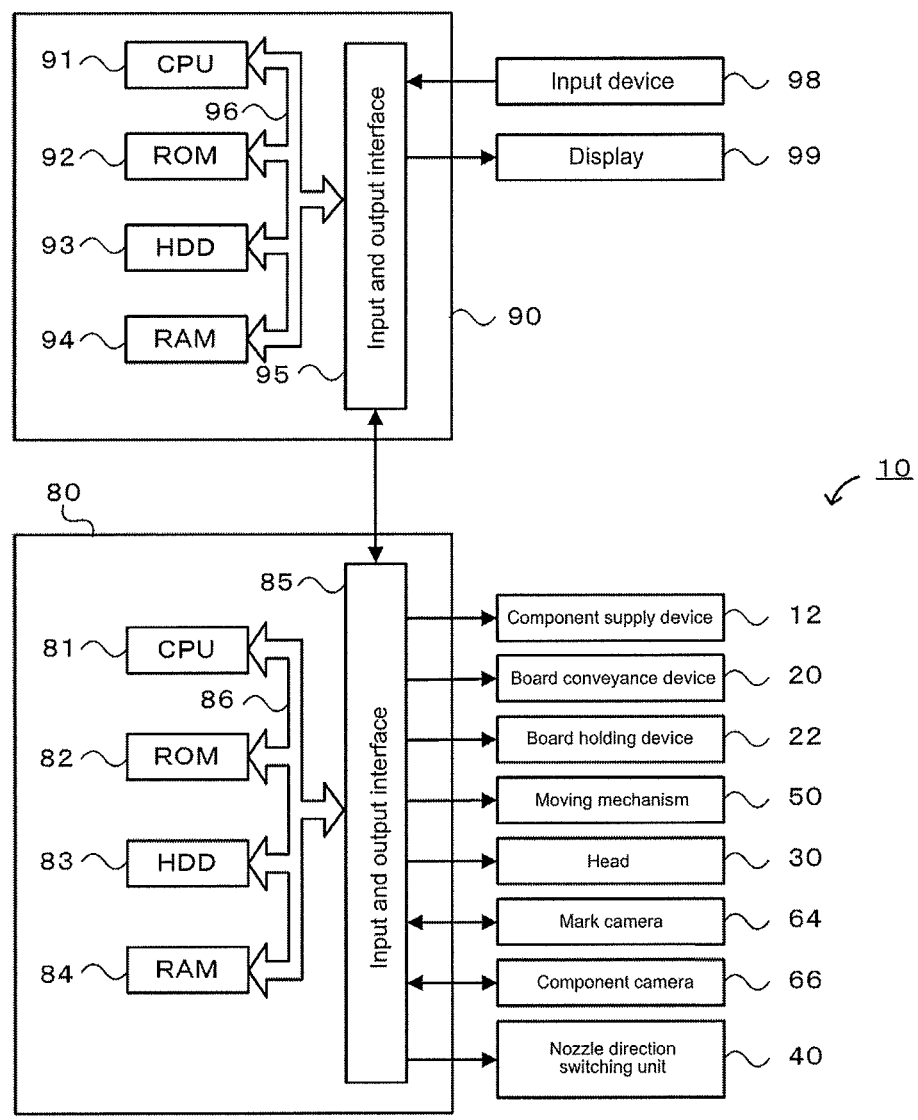
FIG. 2 is a block diagram illustrating a configuration related to control of component attachment apparatus 10.

FIG. 1 is a configuration view schematically illustrating a configuration of component attachment apparatus 10 and FIG. 2 is a block diagram illustrating a configuration related to control of component attachment apparatus 10. A left-right direction in FIG. 1 is an X-axis direction, a front-rear direction is a Y-axis direction, and an up-down direction is a Z-axis direction.

As illustrated in FIG. 1, component attachment apparatus 10 includes component supply device 12 that supplies a component P, board conveyance device 20 that conveys a flat plate-shaped board S from the left side to the right side in FIG. 1, and board holding device 22 that holds the conveyed board S. In addition, component attachment apparatus 10 includes head 30 to which two nozzle holders 31, each of which includes nozzle 62 that picks up (holds) the component P, are attached, moving mechanism 50 that moves head 30, and nozzle direction switching unit 40 for switching a direction in which nozzles 62 of nozzle holder 31 face (nozzle direction). In addition, component attachment apparatus 10 includes mark camera 64 that can image various marks on the board S or component P supplied by component supply device 12, component camera 66 that can image the component P held by nozzles 62, nozzle station 68 in which multiple nozzles 62 (nozzle holders 31) are stocked, and control device 80 (refer to FIG. 2) that controls the entire component attachment apparatus 10.

Component supply device 12 includes tape feeder 14 that supplies components P accommodated in a tape wound on a reel, stick feeder 16 that supplies components P accommodated being arranged in a linearly formed metal stick, a tray feeder (not shown) that supplies components P accommodated in a flat plate-shaped resin tray, and the like.

Figure 3:
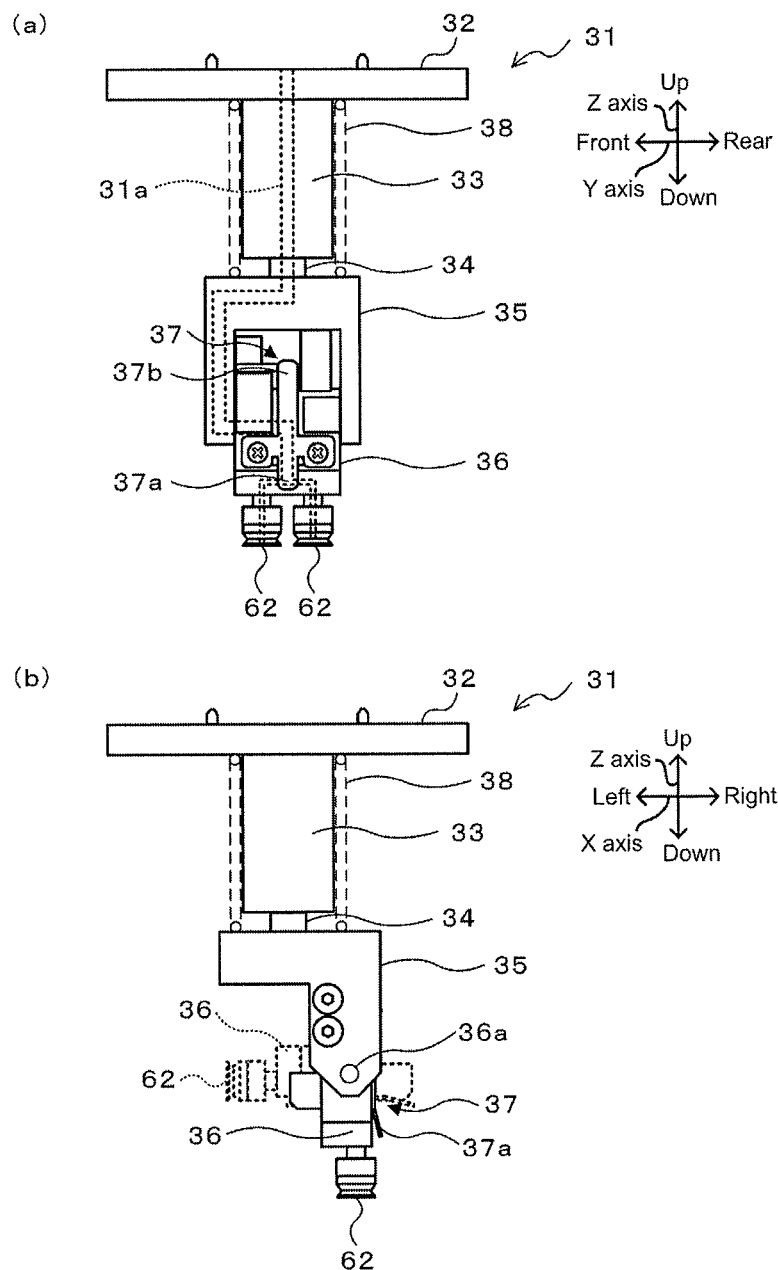
FIG. 3 is a configuration view schematically illustrating a configuration of nozzle holder 31 of head 30.

Head 30 includes a driving section (not shown) that includes a lifting and lowering mechanism and a rotating mechanism in housing 30a and individually lifts or lowers the two nozzle holders 31 in the Z-axis direction or rotates the two nozzle holders 31 around an axis (in a Q direction). FIG. 3 is a configuration view schematically illustrating a configuration of nozzle holder 31 of head 30. FIG. 3 illustrates nozzle holder 31 in a predetermined reference position. FIG. 3 (a) is a view of nozzle holder 31 as seen from the front face (the right side in the X-axis direction) and FIG. 3 (b) is a view of nozzle holder 31 as seen from a side face (the front side in the Y-axis direction). The two nozzle holders 31 have the same configuration. Note that, the number of nozzle holders 31 attached to head 30 is two, but only one nozzle holder 31 may be attached to head 30.

Nozzle holder 31 is detachably attached to the driving section in housing 30a of head 30 via plate 32. In addition, nozzle holder 31 is configured to include a first hollow cylindrical section 33 that is fixed to a lower face of plate 32, a second hollow cylindrical section 34 that is provided to be capable of sliding in first cylindrical section 33, gate-shaped fixed block 35 that is fixed to a lower face of second cylindrical section 34, and rotary block 36 that is rotatably attached to fixed block 35. Coil spring 38 that biases fixed block 35 (rotary block 36) downwards with the lower face of plate 32 as a spring receiving portion is disposed in the outer peripheral area of first cylindrical section 33. Rotary block 36 can rotate around shaft 36a and two nozzles 62 are attached to a lower end thereof. Therefore, head 30 can reliably hold one component P by using two nozzles 62. In addition, the number of nozzles 62 attached to rotary block 36 (nozzle holder 31) is two, but only one nozzle 62 may be attached to rotary block 36 (nozzle holder 31).

Rotary block 36 rotates around shaft 36a by abutting (sliding) onto direction switching member 48 (which will be described later) of nozzle direction switching unit 40. Rotary block 36 can switch between a first direction (illustrated with solid lines in FIG. 3 (b)) in which nozzles 62 face a downward direction (a vertical direction) and a second direction (illustrated with dotted lines in FIG. 3 (b)) in which nozzles 62 face a lateral direction (a horizontal direction). in addition, although not shown, two magnets are attached to rotary block 36. Meanwhile, magnetic members are attached to fixed block 35 at a position where the magnetic member abuts onto one magnet when rotary block 36 faces in the first direction and at a position where the magnetic member abuts onto the other magnet when rotary block 36 faces in the second direction. Therefore, rotary block 36 can maintain either of a state where rotary block 36 faces the first direction and a state where rotary block 36 faces the second direction by means of the magnets. Elastically deformable buffer member 37 that is formed by using a flat spring or the like is attached to a portion of rotary block 36 that abuts onto direction switching member 48. Buffer member 37 includes a rectangular portion of which the longitudinal direction is parallel to the Z-axis direction and inclined sections 37a and 37b, which are inclined in a direction such that the inclined sections are separated from rotary block 36, are formed at opposite ends in the longitudinal direction (upper and lower ends in the Z-axis direction).

In addition, air flow path 31a that connects with an air flow path (not shown) in housing 30a is formed in nozzle holder 31. Air flow path 31a is formed by hollow portions of first cylindrical portion 33 and second cylindrical portion 34, a flow path formed in fixed block 35, an internal portion of shaft 36a, an opening portion that opens in a radial direction from the internal portion of shaft 36a, and a flow path in rotary block 36 that connects with the opening portion, and air flow path 31a is connected to the two nozzles 62. Air flow path 31a can supply air pressure (positive pressure, negative pressure) to nozzles 62 regardless of whether rotary block 36 faces the first direction or the second direction.

Nozzle direction switching unit 40 is configured to include air cylinder 42 that is attached to a base of component attachment apparatus 10 and expands and contracts rod 44 in the Z-axis direction, arm 46 that is attached to a tip end of rod 44 in the Y-axis direction (the horizontal direction), and two direction switching members 48 that are attached to opposite ends of arm 46. Nozzle direction switching unit 40 can switch the nozzle direction of nozzle holder 31 when rod 44 is expanded and arm 46 is in an upper end position, and nozzle direction switching unit 40 does not interfere with nozzle holder 31 (nozzles 62) when rod 44 is contracted and arm 46 is in a lower end position. In addition, direction switching member 48 is a member that abuts onto buffer member 37 of rotary block 36 when the nozzle direction is switched and is configured with a rotatable member such as a bearing. An interval between the two direction switching members 48 (the length of arm 46) is equal to an interval between the two nozzle holders 31 (buffer members 37) attached to head 30. Therefore, nozzle direction switching unit 40 can switch the nozzle directions of the two nozzle holders 31 at the same time.

Figure 4:
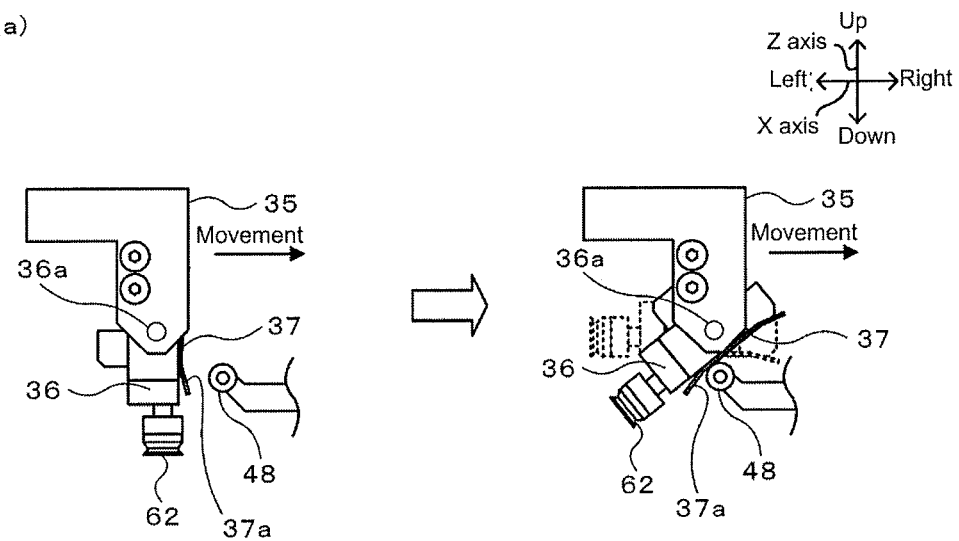
FIG. 4 is a view illustrating how a nozzle direction is switched.
Figure 4:
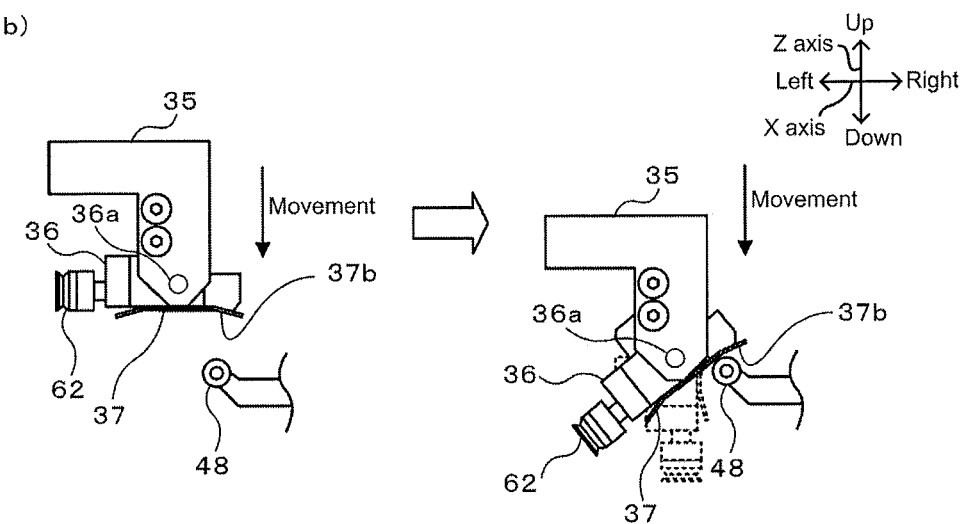

FIG. 4 is a view illustrating how the nozzle direction is switched. In a case where a direction in which nozzles 62 face is changed from the downward direction (the first direction) to a lateral direction (the second direction), first, control device 80 moves nozzle holders 31 (head 30) to a position on the left side in the X-axis direction at which inclined section 37a of buffer member 37 faces direction switching member 48 (a left view of FIG. 4 (a)). Next, control device 80 moves nozzle holders 31 to the right side in the X-axis direction. At this time, nozzle holders 31 move with buffer member 37 (inclined section 37a) abutting (sliding) onto direction switching member 48 and thus rotary block 36 rotates against a magnetic force and the orientation thereof is gradually changed (a left view of FIG. 4 (a)). As a result, a direction in which nozzles 62 face is switched to the lateral direction.

In addition, in a case where a direction in which nozzles 62 face is changed from the lateral direction to the downward direction, first, control device 80 moves nozzle holders 31 (head 30) to a position on the upper side in the Z-axis direction at which inclined section 37b of buffer member 37 faces direction switching member 48 (a left view of FIG. 4 (b)). Next, control device 80 moves nozzle holders 31 to the lower side in the Z-axis direction. At this time, nozzle holders 31 move with buffer member 37 (inclined section 37b) abutting (sliding) onto direction switching member 48 and thus rotary block 36 rotates against a magnetic force and the orientation thereof is gradually changed (a left view of FIG. 4 (b)). As a result, a direction in which nozzles 62 face is switched to the downward direction.

As illustrated in FIG. 1, moving mechanism 50 includes Y-axis guide rail 53 provided along the Y-axis direction, Y-axis slider 54 that can move along Y-axis guide rail 53, X-axis guide rail 51 provided on a side face of Y-axis slider 54 along the X-axis direction, and X-axis slider 52 that can move along X-axis guide rail 51 and to which head 30 or mark camera 64 is attached.

As illustrated in FIG. 2, control device 80 is configured as a microprocessor with CPU 81 as a main component and includes ROM 82, HDD 83, RAM 84, and input and output interface 85 in addition to CPU 81. The above-described components are electrically connected to each other via bus 86. An image signal from mark camera 64 or an image signal from component camera 66 is input to control device 80 via input and output interface 85. Meanwhile, a drive signal to component supply device 12, a drive signal to board conveyance device 20, a drive signal to board holding device 22, a drive signal to moving mechanism 50, a drive signal to head 30, a drive signal to nozzle direction switching unit 40, or the like is output from control device 80 via input and output interface 85. In addition, control device 80 is connected to management device 90 that manages information related to a mounting process via a communication network such that bidirectional communication therebetween can be performed and control device 80 and management device 90 receive or transmit data or a control signal from or to each other.

Management device 90 is, for example, a general-purpose computer and includes CPU 91, ROM 92, HDD 93, RAM 94, and input and output interface 95. The above-described components are electrically connected to each other via bus 96. An input signal from input device 98 such as a mouse or a keyboard is input to management device 90 via input and output interface 95. in addition, management device 90 outputs an image signal to display 99 via input and output interface 95. HDD 93 stores a production program for the board S. The production program for the board S is a program that determines which component P is attached to which position (attachment position) on the board S in component attachment apparatus 10, the order in which components P are attached, and the number of boards S to be manufactured to each of which the component P is attached. In addition, in the present embodiment, an assembly that is obtained by assembling the components P may be attached to the board S. Management device 90 outputs a command signal to control device 80 such that the components P are attached in accordance with the production program.

Figure 5:
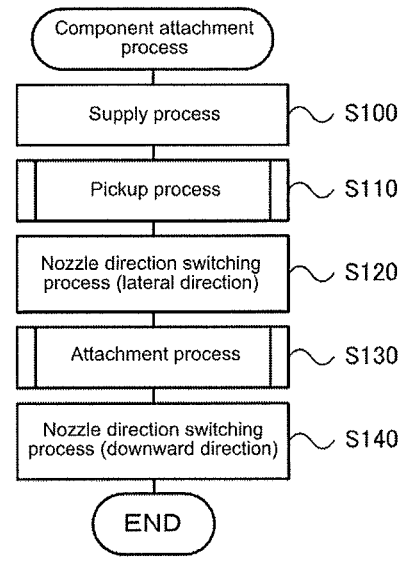
FIG. 5 is a flowchart illustrating an example of a component attachment process that is executed by CPU 81 of control device 80.

Hereinafter, operation of component attachment apparatus 10 configured as described above will be described. FIG. 5 is an example of a component attachment process that is executed by CPU 81 of control device 80. CPU Si of control device 80 executes the process when receiving a command signal from management device 90. For convenience of explanation, a process executed by one nozzle holder 31 will be described.

In the component attachment process, first, CPU 81 of control device 80 executes a supplying process of supplying the component P to a supply position by controlling component supply device 12 (S100) and executes a pickup process of picking up the supplied component P by using nozzle 62 of head 30 (S110). Next, in a case where it is needed to change the nozzle direction such as a case where the component P held by head 30 cannot be attached to board S without a change in orientation, CPU 81 executes a nozzle direction switching process such that a direction in which nozzles 62 face is changed to the lateral direction (the second direction) (S120, refer to FIG. 4(*a*)) and then executes an attachment process of attaching the component P to the board S (S130). When the component P is attached to the board S with the nozzle direction switched, in order to return to the original state, CPU 81 executes the nozzle direction switching process such that a direction in which nozzle 62 faces is changed to the downward direction (the first direction) (S140, refer to FIG. 4(*b*)) and then terminates the component attachment process. When there is a component P that has not been attached, CPU 81 repeats the processes in S100 to S140. In addition, in the nozzle direction switching process, CPU 81 performs a process of outputting a drive signal to nozzle direction switching unit 40 such that rod 44 of air cylinder 42 is moved to the upper end position and outputting the drive signal to nozzle direction switching unit 40 such that rod 44 of air cylinder 42 is moved to the lower end position after the nozzle direction is switched as illustrated in FIG. 4(*a*) or FIG. 4(*b*)

Figure 6:
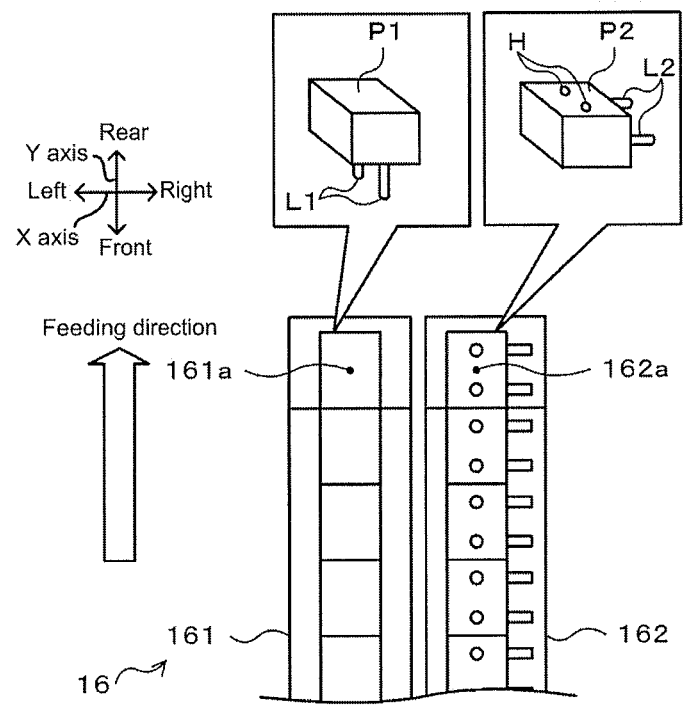
FIG. 6 is a view illustrating an example of a component attached to a board.
Figure 7:
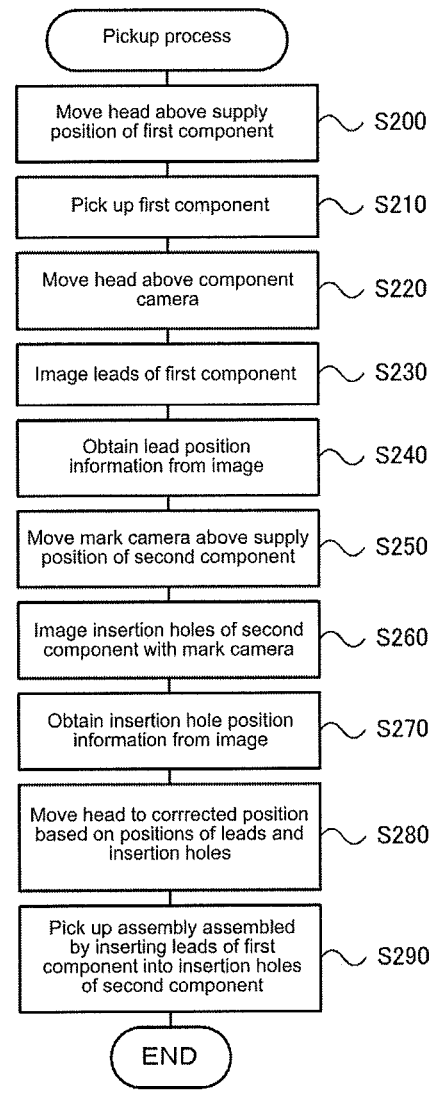
FIG. 7 is a flowchart illustrating an example of a pickup process executed by CPU 81 of control device 80.
Figure 8:
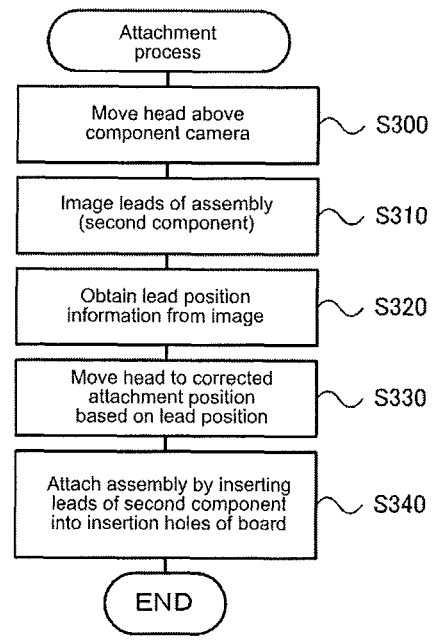
FIG. 8 is a flowchart illustrating an example of an attachment process executed by CPU 81 of control device 80.

Here, FIG. 6 is a view illustrating an example of the component attached to the board. As illustrated, as an example of component P supplied by stick feeder 16, a first component P1 that is supplied to supply position 161*a* of first stick feeder 161 and a second component P2 that is supplied to supply position 162*a* of a second stick feeder 162 are illustrated. The first component P1 is provided with two leads L1 that protrude from a lower face thereof. In addition, the second component P2 is provided with two insertion holes H that are formed in an upper face thereof and into which leads L1 of the first component P1 are inserted and is provided with two leads L2 that protrude from a side face thereof. Both of the components are connected to each other with the leads L1 of the first component P1 being inserted into the insertion holes H of the second component P2 and are attached to the board S in that state. Specifically, when the leads L1 are inserted into (press-fitted into) the insertion holes H in a pressing manner, both of the components are connected to each other. Therefore, both of the components in an assembled state are not likely to be separated from each other, but the first component P1 can be manually removed from the second component P2, for example. Examples of the first component P include a fuse and a DIP IC and examples of the second component P2 include a socket component for detachably (replaceably) attaching a fuse or a DIP IC to the board S. In addition, regarding the second component, a direction in which the insertion holes H face and a direction in which leads L2 face are different from each other by 90 degrees. Therefore, it is necessary to insert (attach) the leads L2 of the second component P2 into insertion holes of the board S after the first component P1 and the second component P2 are assembled and a direction in which the nozzles 62 face is switched such that a direction in which the leads L2 of the second component face is changed to the downward direction. Hereinafter, the pickup process in S110 and the attachment process S130 will be described in detail. FIG. 7 is an example of the pickup process executed by CPU 81 of control device 80, FIG. 8 is an example of the attachment process executed by CPU 81 of control device 80, and FIG. 9 is a view illustrating how the component is attached to the board.

Figure 9:
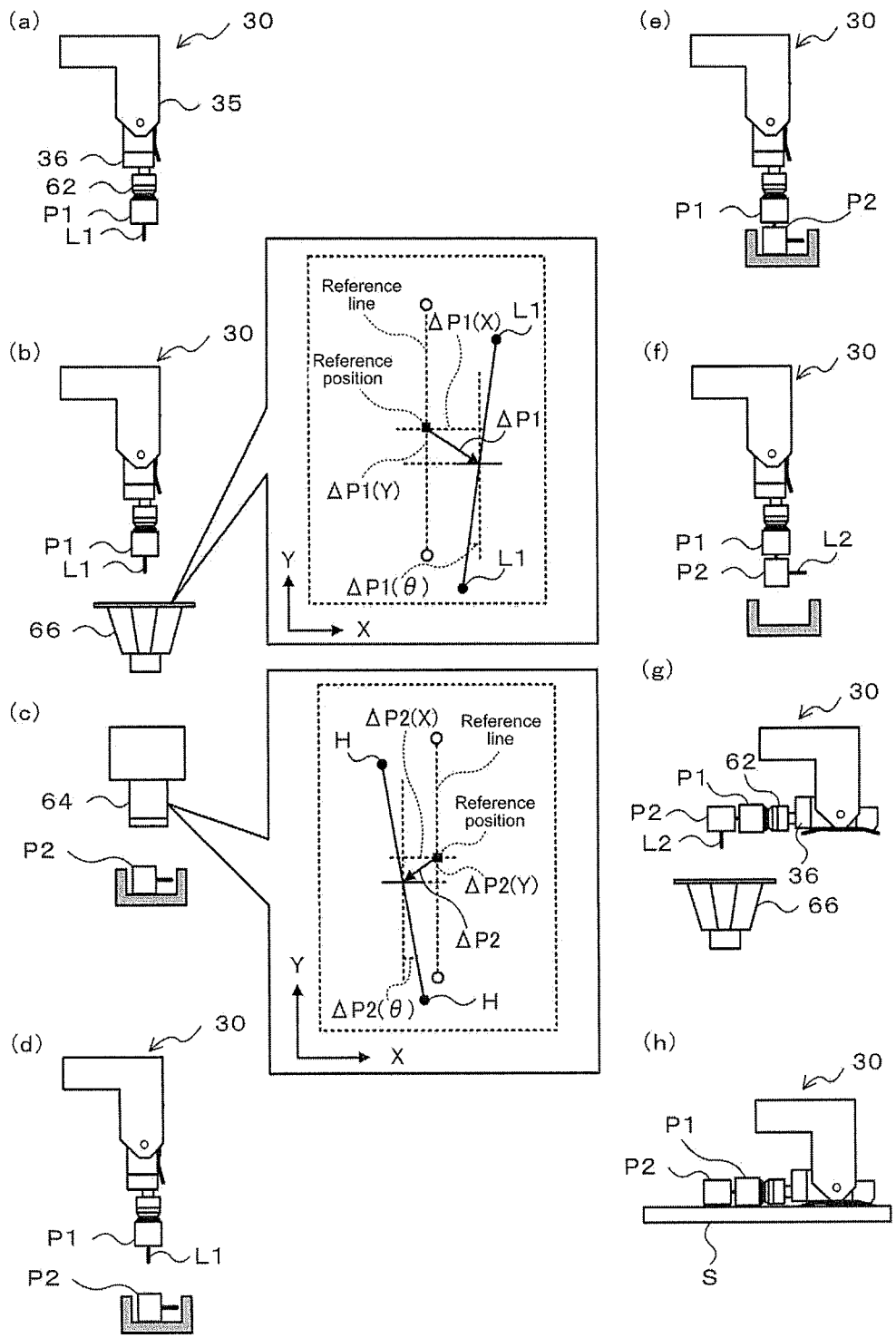
FIG. 9 is a view illustrating how the component is attached to the board.

In the pickup process in S110, first, CPU 81 causes head 30 (nozzles 62) to move to a position above supply position 161*a* of the first component P1 (S200) and causes head 30 to pick up the first component P1 (S210, FIG. 9(*a*)). In S210, CPU 81 performs a process of lowering nozzles 62 (nozzle holders 31) to predetermined positions at which nozzles 62 can pick up the first component P1, generating a negative pressure in air flow path 31*a* such that nozzle 62 picks up the first component P1 when nozzle 62 reaches the predetermined positions, and lifting nozzle 62. Next, CPU 81 causes head 30 to move to a position above component camera 66 (S220) and causes component camera 66 to image the leads L1 of the first component P1 from below (S230, FIG. 9 (*b*)). Then, CPU 81 acquires positional information related to the two leads L1 of the first component P1 from the obtained image (S240). In S240, first, CPU 81 acquires the positions (illustrated with black circles in FIG. 9 (*b*)) of the two leads L1 by processing the obtained image . Next, with respect to a reference line that connects the reference positions of the two leads L1 (illustrated with white circles in FIG. 9 (*b*)) and an intermediate reference position, CPU 81 acquires a positional deviation amount ΔPI of the two leads L1 acquired from the image as the positional information. Note that, CPU 81 acquires a deviation amount ΔP1 (X) in an X direction, a deviation amount ΔP1 (Y) in a Y direction, and a deviation angle ΔP1 (θ) as the positional deviation amount ΔP1.

Next, CPU 81 causes mark camera 64 (head 30) to move to a position above supply position 162*a* of the second component P2 (S250) and causes mark camera 64 to image the insertion holes H of the second component P2 from above (S260). Then, CPU 81 acquires positional information related to the insertion holes H of the second component P2 from the obtained image (S270, FIG. 9(*c*)). In S270, first, CPU 81 acquires the positions (illustrated with black circles in FIG. 9 (*c*)) of the two insertion holes H by processing the obtained image. Next, with respect to a reference line that connects the reference positions of the two insertion holes H (illustrated with white circles in FIG. 9 (*c*)) and a reference position therebetween, CPU 81 acquires a positional deviation amount ΔP2 of the two insertion holes H acquired from the image as the positional information. Note that, CPU 81 acquires a deviation amount ΔP2 (X) in the X direction, a deviation amount ΔP2 (Y) in the direction, and a deviation angle ΔP2 (θ) as the positional deviation amount ΔP2.

Next, CPU 81 causes head 30 (nozzles 62) to move to a position that is obtained through correction with respect to supply position 162*a* of the second component P2 based on the positional information of the leads L1 of the first component P1 that is acquired in S240 and the positional information of the insertion holes H of the second component P2 that is acquired in S270 (S280, FIG. 9 (*d*)). In S280, CPU 81 sets a position (Xa) that is obtained through correction based on the deviation amount ΔP1 (X) and the deviation amount ΔP2 (X) with respect to a reference position in the X direction of supply position 162*a* and sets a position (Ya) that is obtained through correction based on the deviation amount ΔP1 (Y) and the deviation amount ΔP2 (Y) with respect to a reference position in the Y direction of supply position 162*a*. In addition, CPU 81 sets an angle (θa) that is obtained through correction based on the deviation angle ΔP1 (θ) and the deviation angle ΔP2 (θ) with respect to a reference angle related to supply position 162*a*. Then, CPU 81 causes nozzle 62 to move to the set positions (Xa, Ya) and performs a process of matching a rotation angle (a Q axis) of the nozzle 62 with the set angle (θa). In a case where the components P1 and P2 are supplied such that there is almost no angular deviation, the CPU 81 may use a reference angle without acquiring the deviation angle ΔP1 (θ) or the deviation angle ΔP2 (θ) and setting the angle (θa).

Then, CPU 81 causes head 30 to pick up an assembly that is obtained by inserting the leads L1 of the first component P1 into the insertion holes H of the second component P2 such that the first component P1 and the second component P2 are assembled (S290, FIGS. 9 (*e*) and 9 (*f*)) and terminates the pickup process. In S290, CPU 81 performs a process of lifting nozzles after lowering nozzles 62 (nozzle holders 31) to predetermined positions at which the first component P1 picked up by the nozzle 62 can be connected to the second component P2 (predetermined positions at which leads L1 can be reliably inserted into the insertion holes H). CPU 81 performs the process in S290 at the positions and the angle obtained through correction based on the positional deviation amount ΔP1 of the leads L1 and the positional deviation amount ΔP2 of the insertion holes H of the second component P2. Therefore, it is possible to accurately insert the leads L1 into the insertion holes H. Note that, when the pickup process is terminated, a direction in which nozzles 62 face is chanced to the lateral direction (the second direction) in the nozzle direction switching process in S120, so that the leads L2 of the second component P2 face the downward direction.

In the attachment process in S130, first, CPU 81 causes head 30 (nozzles 62), in which the nozzle direction of nozzle holder 31 has been switched in a turning process in S120, to move to a position above component camera 66 (S300, FIG. 9(*g*)) and causes component camera 66 to image the leads L2 of the assembly (the second component P2) (S310). Then, CPU 81 acquires positional information related to the leads L2 of assembly (the second component P2) from the obtained image (S320). In S320, as with the process (FIG. 9(*b*)) in S240, CPU 81 acquires a positional deviation amount of the leads L2. Next, CPU 81 causes head 30 to move to an attachment position that is obtained through correction based on the positions of the leads (S330), attaches the assembly to the board S by inserting the leads L2 of the assembly (the second component P2) into the insertion holes of the board S (S340, FIG. 9(*h*)), and terminates the attachment process. In S330, CPU 81 sets positions or an angle obtained through correction based on the positional deviation amount of the leads L2 of the assembly (the second component P2) with respect to an attachment position included in the command signal of management device 90 and performs a process of moving or rotating nozzles 62 based on the set positions or the set angle. It is a matter of course that CPU 81 may cause mark camera 64 to image the positions of the insertion holes of the board S and may perform correction based on a positional deviation amount of the leads L2 of the assembly (the second component P2) and a positional deviation amount of the insertion holes. In addition, in S340, CPU 81 performs a process of lowering nozzle 62 (nozzle holder 31) to a predetermined positions at which at which the leads L2 of the assembly (second component P2) held by the nozzle 62 can be inserted into the insertion holes of the board S, releasing the assembly (the first component P1) held by the nozzle 62 by generating a positive pressure in the air flow path 31*a* when the nozzle 62 reaches the predetermined positions, and then lifting the nozzle 62.

Here, a correspondence relationship between constituent elements in the present embodiment and constituent elements in the present disclosure will be clarified. Head 30 in the present embodiment corresponds to a head, the first stick feeder 161 corresponds to a first component supply section, the second stick feeder 162 corresponds to a second component supply section, CPU 81 of control device 80 that executes S110 (S200, S210, S280, and S290 in the pickup process in FIG. 7) in the component attachment process in FIG. 5 corresponds to a holding control section, CPU 81 of control device 80 that executes S130 (S330 and S340 in the attachment process in FIG. 8) in the component attachment process corresponds to an attachment control section. In addition, the lead L1 of the first component P1 corresponds to a connecting portion, the insertion hole H of the second component P2 corresponds to a connecting target portion, component camera 66 corresponds to a lower imaging device, mark camera 64 corresponds to an upper imaging device, and CPU 81 of control device 80 that executes S220, S230, S250, and S260 in the pickup process in FIG. 7 corresponds to an imaging control section. Note that, CPU 81 of control device 80 that executes S240 and S270 in the pickup process in FIG. 7 also corresponds to the holding control section. Note that, the present embodiment clarifies an example of a component attachment method of the disclosure by describing operation of component attachment apparatus 10.

Component attachment apparatus 10 as described above assembles the first component P1 and the second component P2 by picking up the first component P1 supplied to supply position 161*a* (a first supply position) of the first stick feeder 161 with head 30 (nozzle 62) and connecting the first component P1 held by head 30 to the second component P2 supplied to supply position 162*a* (a second supply position) of the second stick feeder 162 and then attaches the assembly to the board S. Therefore, in comparison with a case where the first component P1 is attached to the second component P2 after the second component P2 is attached to the board 5, it is possible to stably attach the components P (the first component P1 and the second component P2) to the board S with low influence of warping of the board S. In addition, since the first component P1 and the second component P2 are assembled at supply position 162*a* of the second component P2, in comparison with a case where the first component P1 and the second component P2 are assembled at a position other than supply position 162*a*, it is possible to suppress movement loss of the component P at the time of assembly. Therefore, according to component attachment apparatus 10, it is possible to stably attach the component P to the board S without a decrease in attachment efficiency of the component P.

In addition, component attachment apparatus 10 includes component camera 66 that is capable of imaging the component P picked up by head 30 from below and mark camera 64 that is capable of imaging the component P supplied to the supply position from above. Since component attachment apparatus 10 images the leads L1 of the first component P1 held by head 30 with component camera 66, images the insertion holes H of the second component P2 supplied to supply position 162a of the second stick feeder 162 with mark camera 64, and assembles the first component P1 and the second component P2 at positions and an angle obtained through correction based on captured images such that the leads L1 can be appropriately inserted into the insertion holes H with respect to supply position 162a of the second component P2, it is possible to more accurately assemble the first component P1 and the second component P2 and to prevent assembly failure or the like.

In addition, component attachment apparatus 10 configured such that a direction in which head 30 (nozzles 62) holds the component P (pickup state) can be switched between the first direction that is a downward direction (a vertical direction) and the second direction that is a lateral direction (a horizontal direction) orthogonal to the first direction and holding of the first component P1 or assembly of the second component P2 and the first component P1 is performed in a state where a direction in which head 30 holds the component P is the first direction and attachment of the assembly of the first component P1 and the second component P2 with respect to the board S is performed in a state where a direction in which head 30 holds the component P is the second direction. Therefore, it is possible to cope with even a case where a direction in which the component P supplied to the supply position is picked up is different from a direction in which the component P (assembly) is attached to the board S by 90 degrees. Particularly, since it is difficult to insert the leads L1 of the first component P1 into the insertion holes H in the side face of the second component P2 after attaching the second component P2 to the board S, it can be said that attaching the assembly that is assembled in advance to the board S has a great merit.

In addition, the first component P1 and the second component P2 are connected to each other such that the first component P1 becomes detachable with respect to and from the second component P2 after the first component P1 and the second component P2 are attached to the board S as the assembly. Such components Pare suitable for being attached to the board S after being connected and assembled, therefore, application of the present disclosure is highly meaningful in this case.

In addition, the first component P1 and the second component P2 are connected to each other when the leads L1 that protrude from the lower face of the first component P1 are inserted into the insertion holes H provided in the upper face of the second component P2. Such insertion holes H are generally provided with only a slight gap with respect to the leads L1 and in a case where the second component P2 is attached to the board S first, if the second component P2 is inclined being influenced by warping of the board S, it is difficult to insert the leads L1 into the insertion holes H, therefore, application of the present disclosure is highly meaningful for these components.

Note that, the present disclosure is not limited to the above-described embodiment and it is a matter of course that various embodiments can be made without departing a technical scope of the disclosure.

Figure 10:
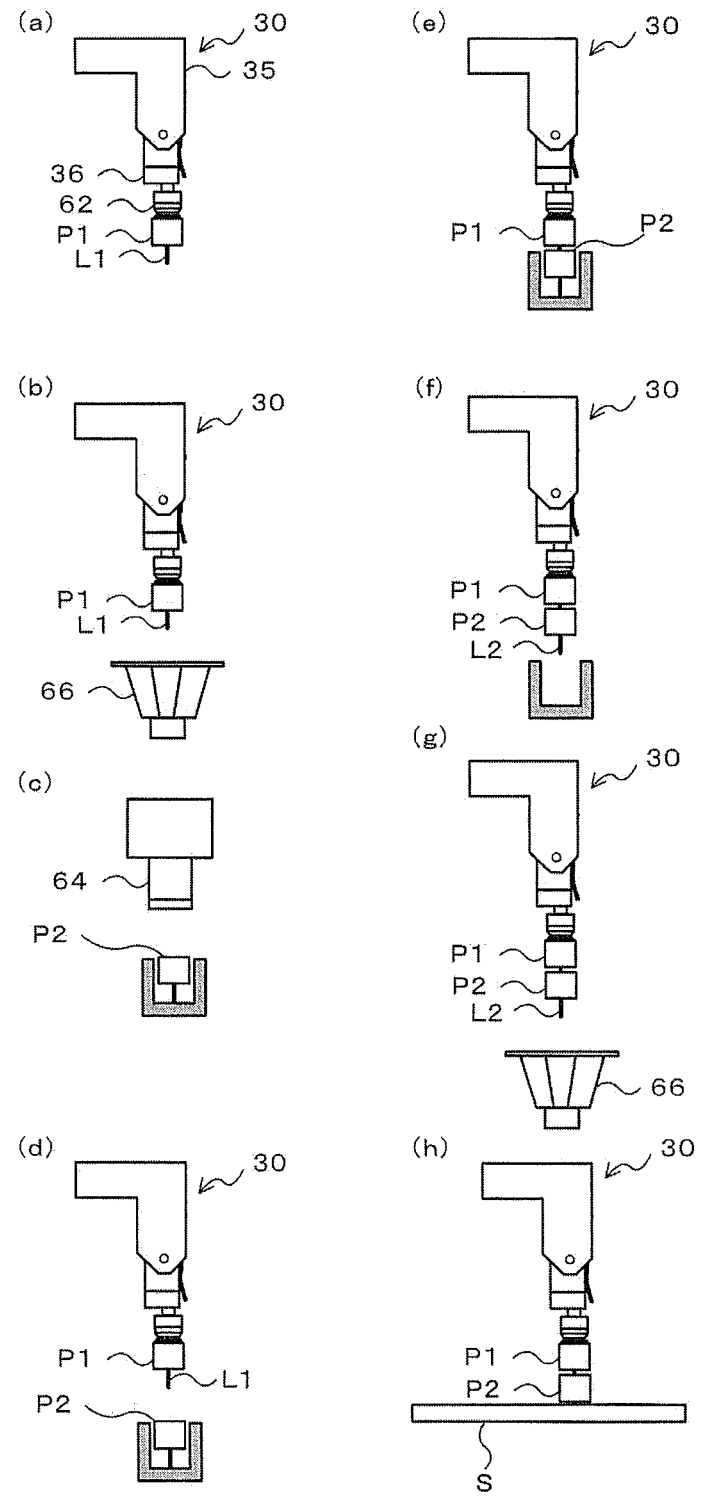
FIG. 10 is a view illustrating how the component is attached to the board in an alternative embodiment.

For example, in the above-described embodiment, the second component P2 is a component in which a direction in which the insertion holes H face is different from a direction in which the leads L2 face by 90 degrees. However, the disclosure is not limited to this and the second component P2 may be a component in which a direction in which the insertion holes H face is the same as a direction in which the leads L2 face, that is, a component in which the insertion holes H are formed on the upper face of the second component P2 and the two leads L2 that protrude from a lower face are provided. In this case, CPU 81 does not have to perform the nozzle direction switching process in S120 and S140 in the component attachment process in FIG. 5. FIG. 10 is a view illustrating how the component is attached to the board in an alternative embodiment. In FIGS. 10 (a) to (f), the same process as in FIGS. 9(a) to (f) except that the leads L2 of the second component P2 face a downward direction is performed. After the assembly is picked up in FIG. 10 (f), CPU 81 causes head 30 (nozzles 62) to move to a position above component camera (FIG. 10 (g)) without changing the nozzle direction and captures an image of the leads of the second component P2. Then, CPU 81 acquires positional information of the leads L2 of the assembly (the second component P2) from the obtained image, causes head 30 to move to the attachment position obtained through correction based on the acquired positional information, and attaches the assembly to the board S (FIG. 10 (h)). As described above, component attachment apparatus 10 may attach the assembly to the board S without changing the nozzle direction. In this case also, it is possible to stably attach the component P to the board S with low influence of warping of the board S. Note that, in a case where there is no change in nozzle direction, nozzle holder 31 does not have to have a function of switching a direction in which nozzles 62 face and a direction in which nozzles 62 face may be fixed to a downward direction (a vertical direction).

In the above-described embodiment, the first component P1 and the second component P2 are supplied via the first and second stick feeders 161 and 162. However, the disclosure is not limited to this and each component may be supplied via a tape feeder or a tray feeder. Since the first component P1 and the second component P2 are assembled at the supply position of the second component P2, it is preferable that a supply device of the second component P2 has such a rigidity that both of the components can be assembled at the supply position.

In the above-described embodiment, both of the components are assembled after the first component P1 is picked up, the first component P1 is imaged by component camera 66, and the second component P2 is imaged by mark camera 64. However, the disclosure is not limited to this order. For example, both of the components may be assembled after the first component P1 is picked up, the second component P2 is imaged by mark camera 64, and the first component P1 is imaged by component camera 66. In this case, CPU 81 may execute the processes in S250 and S260 before S220 in the pickup process in FIG. 7. Such an order may be determined such that efficiency in attaching the component P increases.

In the above-described embodiment, the first component P1 is detachable with respect to the second component P2 even after the first component P1 and the second component P2 are assembled. However, the disclosure is not limited to this and the first component P1 do not have to be detachable with respect to the second component P2.

In the above-described embodiment, a fuse and a DIP IC are used as examples of the first component P1. However, the disclosure is not limited to this and any component (an electronic component) may be used. In addition, the leads L1 provided in the first component P1 are inserted into (press-fitted into) the insertion holes H provided in the second component P2. However, the disclosure is not limited to this and the leads provided in the second component P2 may be inserted into insertion holes provided in the first component P1. Alternatively, the method of connecting both of the components is not limited to the method of connecting both of the components by inserting lead into the insertion hole and may include a method of connecting both of the components by fitting a projection section provided on one component into a recessed section provided on the other component and a method of connecting both of the components by hooking a claw section provided on one component onto an edge of a recess provided on the other component. That is, both of the components may be connected by locking a locking section provided on one component to a locking target section provided on the other component. In addition, both of the components may be connected by using an adhesive or the like without providing such a connecting portion (the locking section) or such a connecting target portion (the locking target section).

In the above-described embodiment, CPU Si sets positions as which the leads L1 are inserted into the insertion holes H based on the positional deviation amount ΔP1 with respect to the reference line that connects the reference positions of the two leads L1 and the reference position or the positional deviation amount ΔP2 with respect to the reference line that connects the reference positions of the two insertion holes H and the reference position. However, the disclosure is not limited to this. For example, a position at which the leads Li are inserted into the insertion holes H may be set based on a positional deviation amount of each lead L1 with respect to a reference position and a positional deviation amount of each insertion hole H with respect to a reference position. Alternatively, in a case where both of the components can be assembled even if there is slight positional deviation such as a case where both of the components are connected by using an adhesive, the correction based on positional deviation does not have to be performed.

In the above-described embodiment, rotary block 36 of nozzle holder 31 maintains the first direction and the second direction by using a magnetic force. However, the disclosure is not limited to this and nozzle holder 31 may have any configuration (a nozzle direction switching configuration). For example, a biasing means for biasing the rotary block in the first direction may be provided. In addition, the second direction may be maintained with a locking section such as a claw portion provided on the rotary block being locked to a locking target section provided on the fixed block or the like when the nozzle direction switching unit switches a direction in which the rotary block faces to the second direction against a biasing force from the biasing means. In addition, the rotary block may return to the first direction with the nozzle direction switching unit releasing the locking section locked to the locking target section.

INDUSTRIAL APPLICABILITY

The described embodiments can be used at least for a component attachment apparatus that attaches a component to a board.

REFERENCE SIGNS LIST

10: component attachment apparatus, 12: component supply device, 14: tape feeder, 16: stick feeder, 20: board conveyance device, 22: board holding device, 30: head, 30a: housing, 31: nozzle holder, 31a: air flow path, 32: plate, 33: first cylindrical portion, 34: second cylindrical portion, 35: fixed block, 36: rotary block, 36a: shaft, 37: buffer member, 37a, 37b: inclined section, 38: coil spring, 40: nozzle direction switching unit, 42: air cylinder, 44: rod, 46: arm, 48: orientation switching member, 50: moving mechanism, 51: X-axis guide rail, 52: X-axis slider, 53: Y-axis guide rail, 54: Y-axis slider, 62: nozzle, 64: mark camera, 66: component camera, 68: nozzle station, 80: control device, 81, 91: CPU, 82, 92: ROM, 83, 93: HDD, 84, 94: RAM, 85, 95: input and output interface, 86, 96: bus, 90 : management device, 98: input device, 99: display, 161: first stick feeder, 161a, 162a: supply position, 162: second stick feeder, P: component, P1: first component, P2: second component, L1, L2: lead, H: insertion hole, S: board

The invention claimed is:

1. A component attachment apparatus which holds a component with a head and attaches the component to a board, the apparatus comprising:
   a first component supply section configured to supply a first component;
   a second component supply section configured to supply a second component that can be connected to the first component;
   a holding control section configured to perform a holding control process of controlling the head such that the head picks up and holds the first component supplied to a supply position of the first component supply section, then connects the first component held by the head to the second component supplied to a supply position of the second component supply section so as to assemble the first component and the second component into an assembly, then picks up the assembly such that the head holds the assembly by holding the first component; and
   an attachment control section configured to perform an attachment control process of controlling the head such that the assembly held by the head is attached to the board.

2. The component attachment apparatus according to claim 1,
   wherein a lower portion of the first component is provided with a connecting portion,
   wherein an upper portion of the second component is provided with a connecting target portion that is connected to the connecting portion,
   wherein the component attachment apparatus further comprises a lower imaging device configured to image the component held by the head from below, an upper imaging device configured to image the component supplied to the supply position from above, and an imaging control section configured to control the lower imaging device such that the lower imaging device images the connecting portion of the first component held by the head from below and controls the upper imaging device such that the upper imaging device images the connecting target portion of the second component supplied to the supply position of the second component supply section from above, and
   wherein the holding control section controls the head such that the first component held by the head is connected to the second component at a position that is set with respect to the supply position of the second component based on images captured by the lower imaging device and the upper imaging device such that the connecting portion and the connecting target portion can be connected to each other.

3. The component attachment apparatus according to claim 1,
   wherein the head is configured to be capable of switching a direction in which the head holds the component between a first direction that is a vertical direction and a second direction that is orthogonal to the first direction, wherein the holding control section performs the holding control process in a state where a direction in which the head faces is switched to the first direction, and wherein the attachment control section performs the attachment control process in a state where a direction in which the head faces is switched to the second direction.

4. The component attachment apparatus according to claim 1, wherein the first component and the second component are connected to each other such that the first component becomes detachable with respect to the second component after the first component and the second component are attached to the board as the assembly.

5. The component attachment apparatus according to claim 1, wherein one of the first component and the second component is provided with a lead that protrudes outwards, wherein the other of the first component and the second component is provided with an insertion hole, and wherein the first component and the second component are connected to each other when the lead is inserted into the insertion hole.

6. A component attachment method in which a component is held with a head and attached to a board, the method comprising:

(a) using the head to pick up and hold a first component supplied to a first supply position;

(b) using the head to connect the first component held by the head to a second component supplied to a second supply position so as to assemble the first component and the second component into an assembly, and pick up the assembly such that the head holds the assembly by holding the first component; and (c) attaching the assembly held by the head to the board.

* * * * *